United States Patent
Gelke et al.

(10) Patent No.: US 6,574,142 B2
(45) Date of Patent: Jun. 3, 2003

(54) INTEGRATED CIRCUIT WITH FLASH MEMORY

(75) Inventors: Hans-Joachim Gelke, Zürich (CH); Axel Hertwig, Nürnberg (DE); Stefan Koch, Zürich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/891,428

(22) Filed: Jun. 26, 2001

(65) Prior Publication Data

US 2002/0011607 A1 Jan. 31, 2002

(30) Foreign Application Priority Data

Jun. 27, 2000 (EP) .............................. 00113610

(51) Int. Cl.[7] .............................................. G11C 16/04
(52) U.S. Cl. .................................. 365/185.11; 365/233
(58) Field of Search ........................... 365/185.11, 233, 365/240; 711/103, 113, 131, 149

(56) References Cited

U.S. PATENT DOCUMENTS

| | | | |
|---|---|---|---|
| 5,493,534 A | 2/1996 | Mok | 365/226 |
| 5,541,886 A * | 7/1996 | Hasbun | 365/185.03 |
| 5,678,082 A | 10/1997 | Miyazawa et al. | 396/300 |
| 5,765,002 A * | 6/1998 | Garner et al. | 365/227 |
| 5,873,112 A | 2/1999 | Norman | 711/103 |
| 2002/0013880 A1 * | 1/2002 | Gappisch et al. | 711/103 |

FOREIGN PATENT DOCUMENTS

| | | | |
|---|---|---|---|
| EP | 0725349 A2 | 8/1996 | G06F/13/16 |
| WO | WO8002881 | 12/1980 | G06F/13/00 |

* cited by examiner

*Primary Examiner*—Richard Elms
*Assistant Examiner*—Anh Phung
(74) *Attorney, Agent, or Firm*—Steven R. Biren

(57) ABSTRACT

This invention relates to the structure and design of microprocessor ICs, in particular to the embedding or integration of a non-volatile flash memory (7) into an IC. To integrate such a flash memory into an IC raises some problems which are solved by providing a dedicated flash bus (3) which operationally links the flash memory (7) with one or more microprocessors (1, 2) on the IC. Preferably, the flash bus (3) controls the flash-memory-specific commands and has a width greater than, in particular a multiple of, the width of the microprocessor (1, 2) and/or the flash memory (7) to compensate for the relatively slow access time of the flash memory. It is especially advantageous to structure the system as a master/slave bus system for operating the flash memory (7) and to link the flash bus via bridges (4, 5, 6) to the microprocessor/s (1, 2,) and through a shell (8) to the flash memory (7). For operating such a system, a flash bus arbiter (9) may be necessary or advantageous.

20 Claims, 5 Drawing Sheets

| Bus Master | Priority | Comment |
|---|---|---|
| Data cache | 1 | Has priority over instruction cache since DSP does not need to fetch new instructions before data accesses of previous instructions are completed |
| Instruction cache | 2 | |
| Flash bridge | 3 | |
| Flash bus lock request | 4 | Bus must be locked before erasing or programming flash memory |

INTEGRATED CIRCUIT WITH FLASH MEMORY

BACKGROUND OF THE INVENTION

1. Field of the Invention

The present invention relates to the structure and design of integrated circuits, i.e. ICs, in particular to the embedding or integration of a non-volatile flash memory into ICs. It may be applied wherever integration of non-volatile memory with microprocessors is desired or required, such as in mobile phones, personal digital assistants, in GPS applications for automobile or other navigation purposes.

2. Description of Related Art

Currently, flash memory embedded into a chip is a new field and only few implementations yet exist. In the future however, embedding of memory in ICs is likely to become very common. This especially holds true for the mobile product market where the integration of memory into the baseband processors is already a customer request. Integration of memory on chip is a way to fill up real estate available on silicon with smaller feature sizes. Integrated flash memories provide many advantages:

- reduced component count and smaller area requirement,
- reduced pin count with reduced system cost,
- faster access to memory,
- increased firmware/software protection,
- reduced power consumption.

The present invention describes a way to embed flash memory in a multiprocessor environment on one single chip, with the emphasis on maximized performance. Furthermore, the requirements of embedded flash memory with regard to programming, reading, testing, and evaluation are optimized such that the result is a superior architecture and product.

Additionally, the proposed architecture allows to emulate flash memory in prototypes while the flash technology is still under development and thus helps to achieve faster time to market.

Currently, flash memory in digital processing systems is built with discrete "off the shelf" semiconductor devices, connected to the microprocessor via a circuit board or bonded in a multi chip package. Access is usually accomplished through a non-intelligent, low performance, high pincount external memory interface. An example for such an arrangement is shown in Mok U.S. Pat. No. 5,493,534 which shows a single chip microcontroller with a plurality of I/O ports communicating with a flash memory. This flash memory, however, is not embedded into the chip.

Embedding a flash memory into a chip leads to certain problems that have to be solved before such embedded memory works with the expected advantages.

By "nature", the absolute speed of flash memory is low compared to read-only-memory, ROM, whether embedded or not. To overcome this limited performance, the applied architecture must be carefully chosen.

Also, the power dissipation has to be carefully weighted versus the required performance at a defined voltage. Altogether, this can be turned to an advantage for a embedded flash memory system as optimization is possible, compared to the discrete solution, but it also implies that specific know-how is required from the design crew.

Usually, integrated flash memory must provide means with similar functionality as known from discrete devices. This means that extensive overhead must be designed for the implementation of flash management functions like program cycles, program suspend cycles, erase cycles and array load cycles. Additionally, hardware is required for evaluation and testing.

Testing of on-chip flash memory may also generate new problems, especially with regard to total device test time. Generally, testing digital logic requires test times of few seconds only, while memory testing usually is a comparably lengthy process, usually requiring more than a few seconds. Here, solutions must be found to access and test flash memory efficiently.

BRIEF SUMMARY OF THE INVENTION

In brief, the present invention solves the above-identified issues by providing a dedicated bus system, in particular a master/slave bus system, for operating a flash memory embedded into a processor IC, especially a multi-processor IC. Preferably, specific requirements of and/or commands for the embedded flash memory like "load", "program", "erase", "program suspend", "erase suspend", etc., are controlled by the flash bus.

In a particular variation, the flash memory is linked to the flash bus through a shell; this shell may be a slave to the flash bus.

In a further embodiment, the microprocessor(s) on the IC and/or the usually existing system bus(es) may be connected to the flash bus through bridges; these bridges may be masters to the flash buse(s). In a variation, any of the bridges may be provided with a cache to further speed up operation.

There are numerous further additions and variations envisageable from the following description of embodiments concerning the architecture around a dedicated, high bandwidth flash bus according to the present invention, including, but not limited to, numerous flash memory supporting blocks like the shell and the bridges to multiprocessor environments.

BRIEF DESCRIPTION OF THE DRAWINGS

In the following, examples how to implement the present invention shall be shown. Several figures illustrate these implementations; in these show FIG. 1 "minimal" flash bus multiprocessor system.

Generally, identical reference numerals are used for identical parts in various figures.

DETAILED DESCRIPTION OF THE INVENTION

Figure 1:
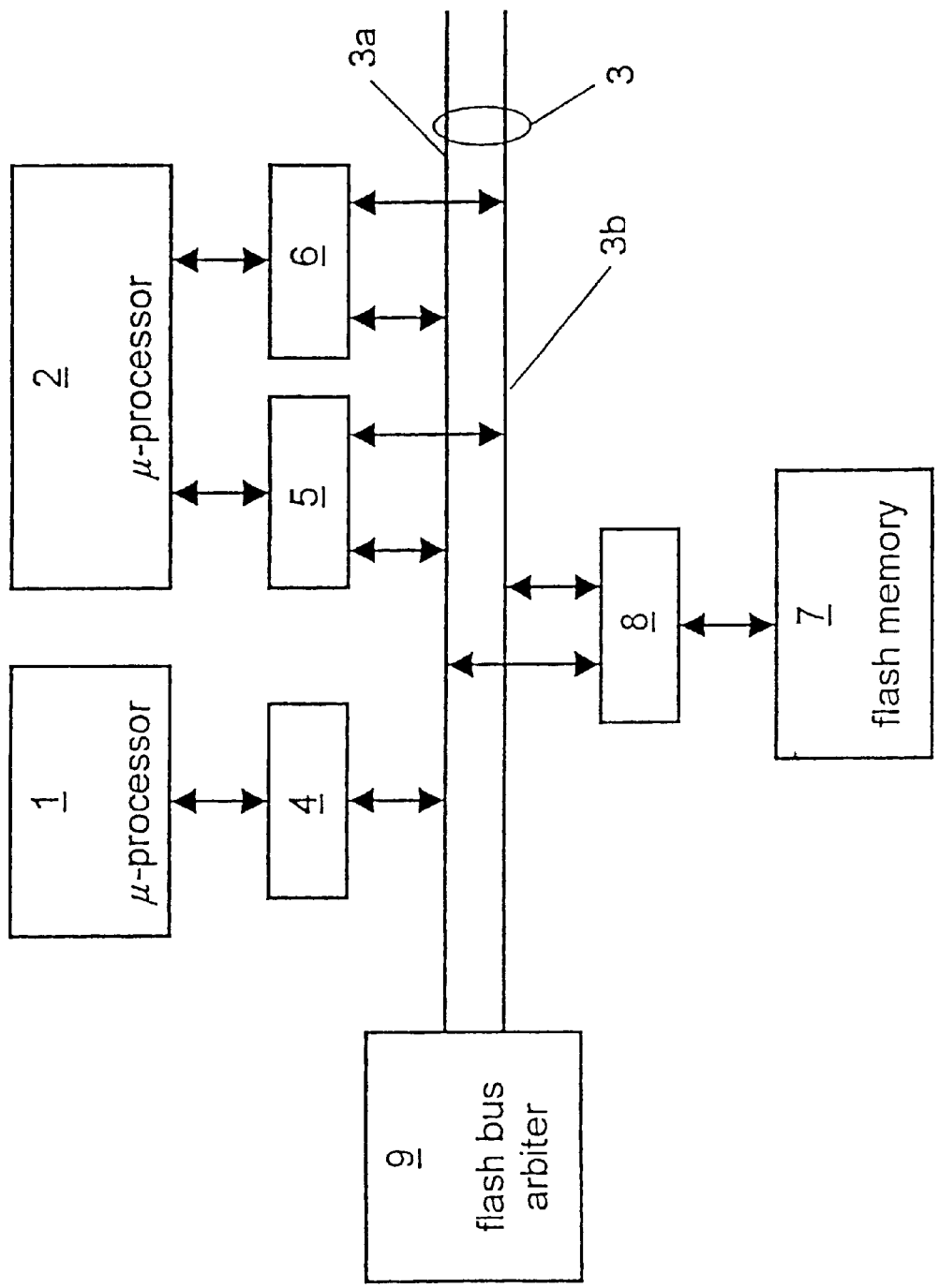

FIG. 1 depicts a multiprocessor system with an embedded flash memory according to the invention. Two microprocessors 1 and 2 are provided, whose buses are linked to a flash bus 3 through "flash bridges" 4, 5, and 6; these are the masters on the flash bus, as explained below. The flash memory 7 is linked to the flash bus 3 through a logic called "flash shell", which is a slave to the flash bus. The flash shell 8 may also incorporate facilities for on-chip testing of the flash memory, but this is of lesser interest in this context.

Microprocessor 2 has multiple buses, as known e.g. from the so-called DSP double Harvard architecture known in the art, it accesses the flash bus 3 via two flash bridges 5 and 6. Data transfer between the various components shown in FIG. 1 may be unidirectional or bidirectional.

A data and address bus 3a, part of the flash bus 3, provides addresses and data for the memory cells (not shown) in the flash memory 7. A control signal bus 3b, also part of the flash bus 3, exchanges signal access rights and status information between the flash bridges 4 to 6 and the flash shell 8. Finally, a flash bus arbiter 9 controls access and traffic on the bus 3.

Since two processors 1 and 2 share the same flash memory 7, space in the latter will be allocated by software—and thus very flexible—to each processor.

The flash bridges 4 to 6 are the interfaces between each of the microprocessors 1 and 2 and the flash bus 3. Each flash bridge will send requests to the flash bus when it needs access to the bus and it is able to control program and erase cycles of the flash memory 7.

The flash bus 3 has a bus width which is a multiple of the microprocessor's width to compensate for the flash memory's limited access performance.

In the embodiment shown, each of the flash bridges 4 to 6 provides the width conversion between the microprocessor's width, e.g. 32 bit, and the flash bus width, e.g. 128 bit. Two of the flash bridges shown, i.e. flash bridges 4 and 5, also contain a data cache device for recently used accesses. The latter increases transfer speed in a known way.

The flash shell 8 is the interface between the flash memory 7 and the flash bus 3. It messages the flash bus 3 when the flash memory 7 is busy for programming or erasing. The flash shell 8 may also signal the bus arbiter 9 when data read from the flash memory 7 is available. Further, the flash shell 8 contains the facilities for testing the flash memory 7; this testing is also controlled by the flash bus 3.

Flash bus control signals, e.g. for requests, grants and/or acknowledgements, link any of the flash bridges 4 to 6, the flash shell 8, and the flash bus arbiter 9. These control signals, here part of the flash bus 3, could also be transferred by a separate, preferably intelligent, parallel or serial bus, communicating with the above, i.e. the flash bridges 4 to 6, the flash shell 8, and the flash arbiter 9.

The data and address bus 3a, part of the flash bus 3, transports data to and from any of the flash bridges 4 to 6 and the flash shell 8.

The flash bus arbiter 9 receives the requests from the bus masters, i.e. any of the flash bridges 4 to 6, and assigns the slave(s), here flash shell 8 in particular. In the embodiment shown, access priority encoding is implemented. When an intelligent bus system is used, the latter may also receive and send messages to bus masters and slaves.

The flash bus protocol carries the information necessary to control the slaves, masters and the flash bus arbiter. In an intelligent bus system, the flash bus protocol may be embedded in the control messages. In other applications, it may be implemented by hardware. The tasks of the flash bus protocol include:

Indicating which is the requesting master of the bus;

Indicating the availability of the slaves for read and write;

Indicating the availability of the flash data/address bus;

Indicating the availability of valid flash read data;

Evaluating if a flash memory is locked for program or erase cycles;

Enabling of memory testing;

Evaluating control and status registers of the flash shell(s) and the flash bus arbiter.

Triggering program and erase cycles in the flash memory.

Facilitating data transfer between the flash bus masters and slaves.

Figure 2:
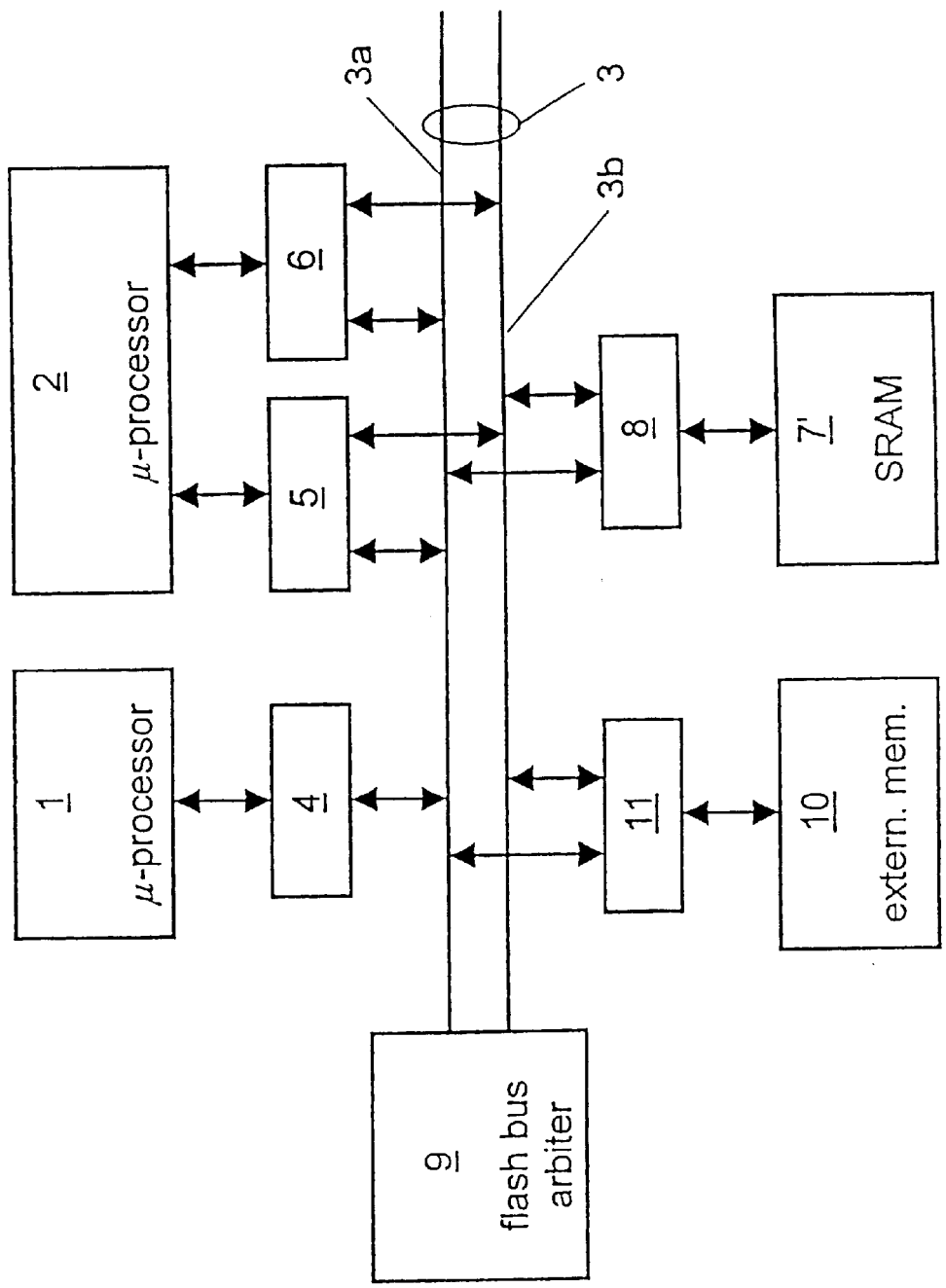
FIG. 2 an emulation of a flash memory.

FIG. 2 shows an embodiment that allows flash memory emulation. While a flash memory is under development, it may be necessary to emulate the flash memory with SRAM 7'. Since the memory is connected to the flash bus 3 via the flash shell 8, it is very easy to connect other types of memory, because only the flash shell 8 needs to be adapted. Since the wait states are controlled through the flash bridges 4 to 6, the memory behaviour can be adjusted such that it is identical to the emulated device.

If the flash shell 8 is replaced by a memory controller 11, also shown in FIG. 2, even an external memory 10, e.g. a synchronous DRAM, can be connected to the flash bus 3.

Figure 3:
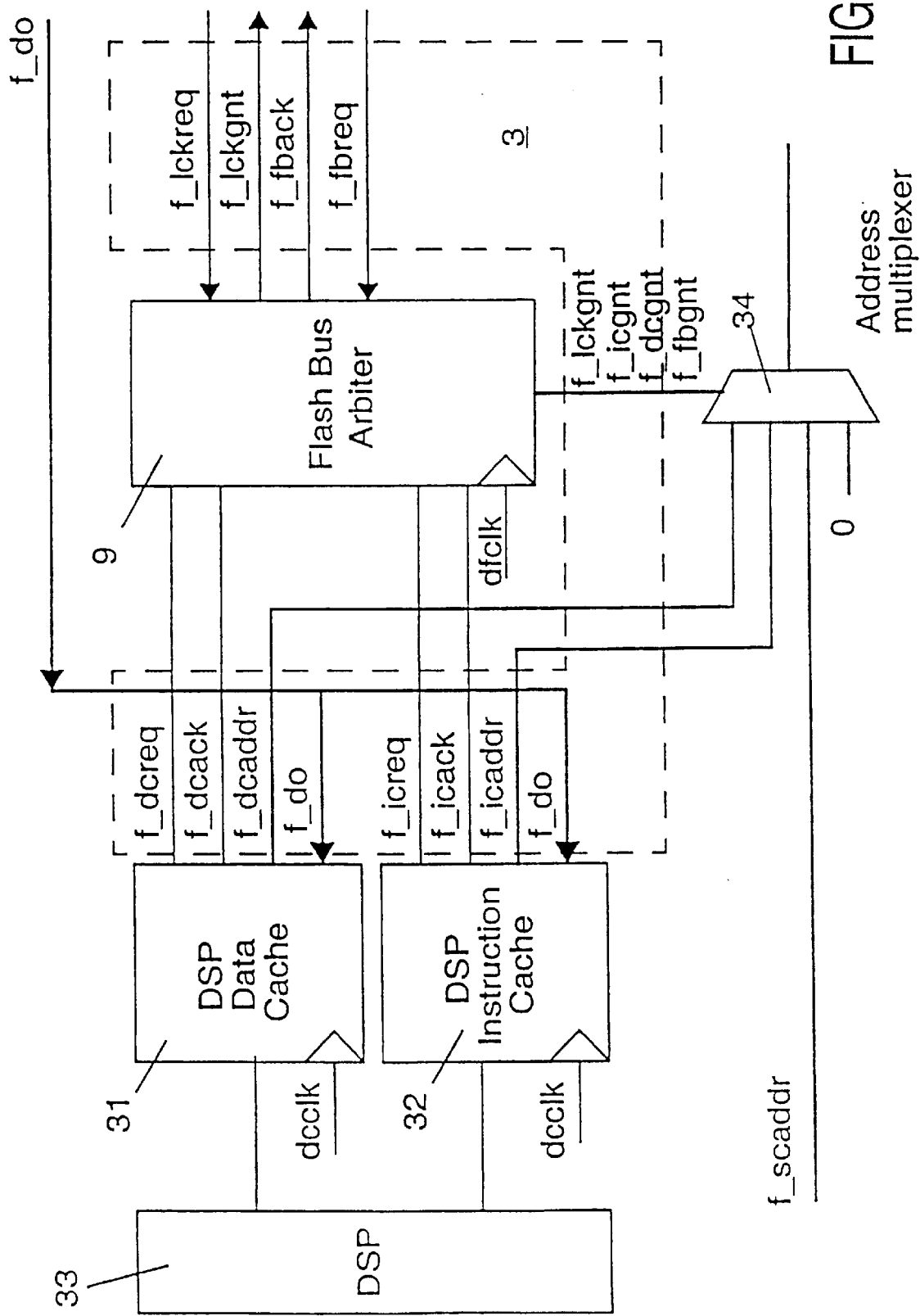
FIGS. 3 and 4 details of the flash bus components.
Figure 4:
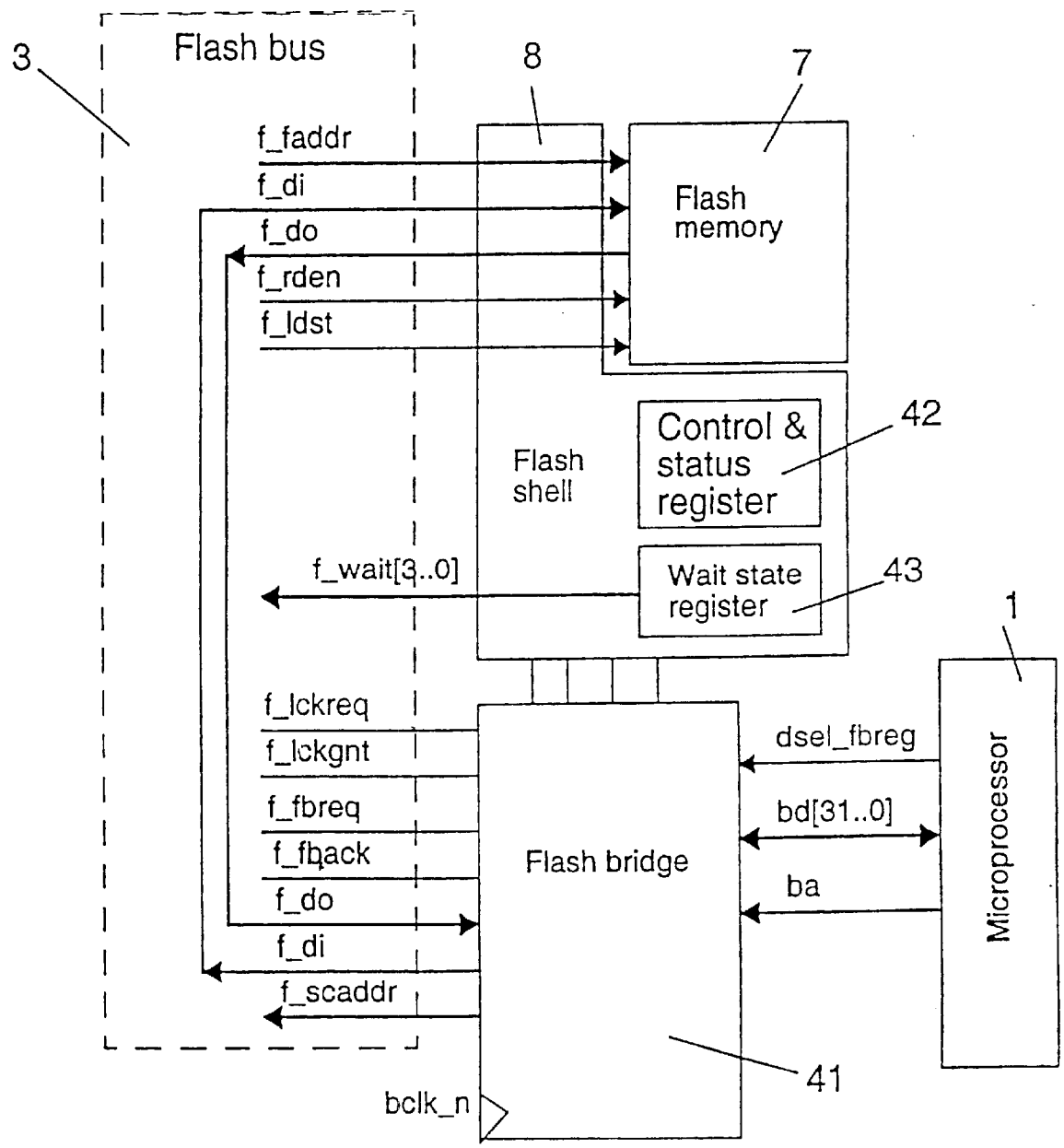

FIGS. 3 and 4 show an implementation of a flash bus according to the invention in a baseband IC of a mobile phone. As illustrated in FIG. 3, a data cache 31 and an instruction cache 32 of a DSP 33 are linked to the flash bus 3. Further down, the also shown flash bus arbiter 9 and its interaction with the DSP caches 31 and 32 are described in detail.

The flash shell 8 is illustrated in FIG. 4. As shown, the actual flash memory 7 is so-to-speak embedded into an interface shell, the flash shell 8, which contains the control logic, i.e. the control and status registers 42, eventually a wait state register 43 and possibly some error correction circuitry or software. In an emulation version of the IC (cf. FIG. 2 and the associated description above), the flash shell 8 may further contain some other memory like static RAM (SRAM) or an external bus interface to connect to memory outside the chip. The flash shell 8 is a slave of the flash bus.

Flash memory cycles include read cycles, data load cycles, program cycles, erase cycles, and program/erase suspend cycles. During load cycles, data which are applied together with an address, are written into data latches before they are transferred to the memory array during the program cycle. A program cycle is started after all data latches are filled. Such a program cycle might take a few milliseconds, during which the flash memory cannot be used for read or load cycles. Similarly, an erase cycle might take a few milliseconds, during which the flash memory cannot be used for read or load cycles.

The two DSP caches shown in FIG. 3, the data cache 31 and the instruction cache 32, each have an interface to the flash bus 3. The latter is also the path to fill instruction and data cache lines on cache misses. The data and the instruction caches 31 and 32 are bus masters to the flash bus 3.

The flash bridge 41 shown in FIG. 4 connects the microprocessor 1 to the flash bus 3 and the flash shell 8, to which the microprocessor 1 has read and write access. The flash bridge 41 also converts data from the 16-bit or 32-bit bus mode of the memory bus to the 128-bit bus width of the flash bus 3. Further, the flash bridge 41 is a master of the flash bus 8.

Figures 5, 6:
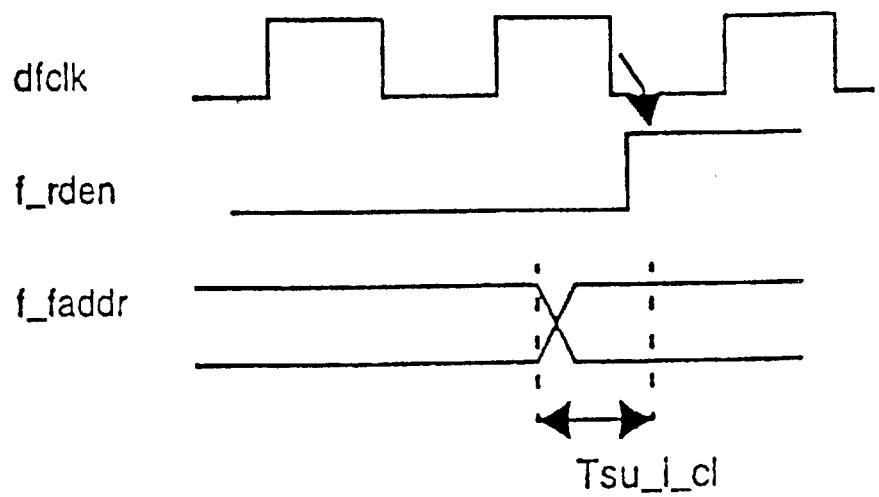
FIG. 5 a table of a flash bus master priority list.
FIG. 6 a strobe signal for synchronous memory modes.

Since the two DSP caches shown in FIG. 3, i.e. data cache 31 and instruction cache 32, and the flash bridge 41 compete as masters on the flash bus, bus arbitration is required. This is performed by a flash bus arbiter 9, also shown in FIG. 3. Ideally, arbitration cycles should consume very little or no overhead. If two or more bus masters request a bus access, a decision is made which requester gets the bus. The decision is made according to a priority list, an example of which is shown in the table of FIG. 5. After every bus access, the decision which bus master is next is made without considering the previous accesses. Bus accesses in progress are not aborted by a higher priority bus request. Usually, the DSP caches 31 and 32 have the highest priority, since their performance is critical. Since the flash bus load is low, it is not likely that a requester with a lower priority is neglected or inhibited from gaining access to the flash bus 3.

Since the data and instruction caches 31 and 32 require fast accesses to the flash memory 7 without re-synchronizing the request and acknowledge signals to the flash bus arbiter 9, the latter is clocked synchronous (clock signal dfclk in FIG. 3) to the DSP caches 31 and 32 (clock signals dcclk). Since flash bridge 41 accesses to the flash memory 7 may also happen while the DSP core is sleeping, the clock to the flash arbiter 9 (clock signal dfclk) is running when the system controller and/or the DSP is/are active.

Next, the cache arbitration and fetch cycles shall be described. When the DSP caches 31 and/or 32 request data from the flash shell ("cache line fill"), the requesting bus master validates signal f_dcaddr or f_icaddr, resp., (FIG. 3) and activates the required request signal. This is signal f_dcreq for the data cache 31 and f_icreq for the instruction cache 32, respectively. According to which master has priority on the bus, and if the bus is not already busy by another master, or locked, the flash bus arbiter 9 grants the access by issuing a grant signal to the address multiplexer. This are the signals f_dcgnt for the data cache 31 and f_icgnt for the instruction cache 32, respectively. According to the bus grant signal, the address multiplexer 34 steers the address bus to the granted master. Signal f_rden enables the flash memory 7 during read cycles. Once the flash memory's output data bus (signal f_do) is stable, the flash bus arbiter 9 pulls the appropriate acknowledge signals active, i.e. signal f_dcack for the data cache 31 and f_icack for the instruction cache 32. On the next rising edge of clock signal dcclk, the granted master registers the data and continues its cycle.

In the following, the above-mentioned wait states shall be illustrated. Depending on the clock speed of the DSP 33, the flash bus cycles may need to be stretched by inserting wait states into the cache fetch or flash bridge access cycles. This inserting is done by delaying the acknowledge to the requesting source. After the access is granted, the number of dcclk cycles is counted until the required wait state number is reached, then the flash bus arbiter 9 asserts signal f_dcack or f_icack to indicate to the bus master that the required wait states have been inserted and therefore data from the flash memory 7 must be valid. The amount of wait states being inserted is determined by the wait state register 43 in the flash bridge 41. After reset, the wait state register is set to insert the maximum number of wait states.

In the following section, the flash memory read cycles shall be addressed. When the flash bridge 41 requests data from the flash shell 8, the requesting bus master validates the signal f_addr and activates the required request signal f_fbreq. Depending on which master has priority on the bus and if the bus is not already busy from another master, or locked, the flash bus arbiter 9 grants the access by issuing a grant signal to the address multiplexer; this is signal f_fbgnt. According to this grant signal, the address multiplexer 34 steers the address bus to the granted master. Signal f_rden enables the flash memory 7 during read cycles. Once the flash memory output data bus (signal f_do) is stable, the flash bus arbiter 9 pulls the appropriate acknowledge signal active. On the next rising edge of clock signal dcclk, the granted master registers the data and continues its cycle. The diagram in FIG. 6 shows the fastest possible flash bridge read cycle.

A flash bus request may be removed prematurely, i.e. the signals f_screq, f_icreq and f_dcreq may be removed even before the flash bridge 41 sends an acknowledge signal to the requesting masters. This is the case when the cache aborts a flash access cycle; e.g. before the DSP is going to sleep mode. When any of the signals f_dcreq or f_icreq, resp., is removed before the corresponding signal f_dcack or f_icack, resp., the flash access cycle is completed safely and the corresponding signal f_dcgnt or f_icgnt, resp., is removed one clock cycle later.

The loading of data into the flash memory 7 via flash bridge 41 shall now be described. When the flash bridge 41 requests writing data to the flash shell 8, it validates the data on the f_di bus and the address on the f_addr bus and activates signal f_fbreq. When a previous flash bus cycle is completed, the flash bus arbiter 9 grants the cycle by applying signal f_fbgnt. The rising edge of signal f_ldst registers the data into the flash memory data latches. Activating signal f_fback indicates to the flash bridge 41, that data has been latched by the flash memory and that data and addresses can now be removed. When the f_fback signal becomes active, the flash bridge removes f_fbreq together with f_addr. The f_di bus is forced to zero by the flash bridge 41 when f_fbreq is removed.

Finally, the flash erase and program cycles will be addressed. During a flash erase cycle, a whole flash sector gets erased. During a flash program cycle, the contents of the flash data latches is transferred into the flash memory array. Erasing and programming the flash memory 7 needs several milliseconds. During this time, neither the flash memory 7 nor the flash bus 3 may be accessed. Thus, before the flash memory 7 can be programmed or erased, the flash bus 3 must be locked for accesses from the caches and/or the flash bridge. This is done by the system controller by setting a bus lock bit in the flash control register. The bus lock bit is causing signal f_lckreq to go active, signalling to the flash bus arbiter 9 to lock the bus for further bus master accesses after the current access cycle is completed. After the flash bus arbiter 9 locked the cycle, it activates signal f_lckgnt, which is reflected in the flash control and status register 42. The system controller may now initiate a flash program or erase cycle. Once this flash program or erase cycle is completed, the system controller must clear the lock bit in the flash control and status register 42 again and thus the f_lckreq signal is removed. The duration of the erase and program cycles may be timed by the clock in the system controller, or by a dedicated timer.

Though the invention has been shown and explained based on a specific example, the person skilled in the art easily recognizes that many variations may be introduced and many functions altered without departing from the spirit and scope of the invention.

What is claimed is:

1. An integrated circuit with at least one microprocessor and at least one embedded memory, wherein said memory is a non-volatile or flash memory (7), and a dedicated flash bus (3) is provided, operationally linking said microprocessor (1, 2) with said memory (7), and wherein the flash bus (3) is a master/slave bus system for operating the flash memory (7).

2. The integrated circuit of claim 1, wherein
   the flash bus (3) controls the flash-memory-specific commands.

3. The integrated circuit of claim 1, wherein the flash bus (3) has a data width greater than, in particular a multiple of, the data width of at least one of the microprocessor (1, 2) and the flash memory (7).

4. The integrated circuit of claim 1, wherein the flash bus (3) comprises a data/address bus part (3a) and a control signal bus part (3b).

5. The integrated circuit of claim 1, wherein the flash bus (3) is linked to at least one of the microprocessor (1, 2) and a bus of a microprocessor, through a bridge (4, 5, 6).

6. The integrated circuit of claim 5, wherein the flash bus (3) has a data width greater than, in particular a multiple of, the data width of the microprocessor (1, 2), and wherein the flash bridge (4, 5) provides the width conversion between the flash bus (3) and the linked microprocessor (1, 2).

7. The integrated circuit according to claim 5, wherein the flash bridge (4, 5) includes a cache for intermediate storage of at least one of data, addresses and command signals.

8. The integrated circuit of claim 5, said bridge being a master to said flash bus (3).

9. The integrated circuit of claim 1, wherein a plurality of microprocessors (1, 2) is linked directly or indirectly to the flash bus (3) connected to the flash memory (7).

10. An integrated circuit with at least one microprocessor and at least one embedded memory, wherein said memory is a non-volatile or flash memory (7), and a dedicated flash bus (3) is provided, operationally linking said microprocessor (1, 2) with said memory (7), and wherein the flash memory (7) is linked to the flash bus (3) through a shell (8).

11. The integrated circuit of claim 10, said shell (8) being a slave to said flash bus (3).

12. The integrated circuit of claim 10, wherein the flash bus (3) is a master/slave bus system for operating the flash memory (7).

13. The integrated circuit of claim 10, wherein the flash bus (3) is linked to at least one of the microprocessor (1, 2) and a bus of a microprocessor, through a bridge (4, 5, 6).

14. The integrated circuit of claim 13, said bridge being a master to said flash bus (3).

15. The integrated circuit of claim 10, wherein the flash bus (3) has a data width greater than, in particular a multiple of, the data width of at least one of the microprocessor (1, 2) and the flash memory (7).

16. An integrated circuit with at least one microprocessor and at least one embedded memory, wherein said memory is a non-volatile or flash memory (7), and a dedicated flash bus (3) is provided, operationally linking said microprocessor (1, 2) with said memory (7), and wherein a flash bus arbiter (9) is provided, controlling access and traffic, and arbitrating competing requests on the flash bus (3).

17. The integrated circuit of claim 16, wherein the flash bus (3) is a master/slave bus system for operating the flash memory (7).

18. The integrated circuit of claim 16, wherein the flash bus (3) is linked to at least one of the microprocessor (1, 2) and a bus of a microprocessor, through a bridge (4, 5, 6).

19. The integrated circuit of claim 18, said bridge being a master to said flash bus (3).

20. The integrated circuit of claim 16, wherein a plurality of microprocessors (1, 2) are linked to the flash bus (3) connected to the flash memory (7).

* * * * *